United States Patent
Lu et al.

(10) Patent No.: US 10,886,342 B2
(45) Date of Patent: Jan. 5, 2021

(54) DISPLAY PANEL AND DISPLAY DEVICE

(71) Applicant: WuHan TianMa Micro-Electronics Co., Ltd., Wuhan (CN)

(72) Inventors: Xing Lu, Wuhan (CN); Yangzhao Ma, Wuhan (CN); Tao Peng, Wuhan (CN); Yongzhi Wang, Wuhan (CN); Min Li, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 126 days.

(21) Appl. No.: 16/151,498

(22) Filed: Oct. 4, 2018

(65) Prior Publication Data
US 2019/0393283 A1    Dec. 26, 2019

(30) Foreign Application Priority Data
Jun. 21, 2018   (CN) .......................... 2018 1 0642650

(51) Int. Cl.
  *H01L 27/32* (2006.01)
  *G06K 9/00* (2006.01)
(52) U.S. Cl.
  CPC ........ *H01L 27/3246* (2013.01); *G06K 9/0004* (2013.01); *H01L 27/3216* (2013.01)
(58) Field of Classification Search
  CPC .................................................. H01L 51/525
  See application file for complete search history.

(56) References Cited

U.S. PATENT DOCUMENTS

2014/0319479 A1*  10/2014  Park ...................... H01L 51/525
                                                                  257/40
2017/0155075 A1*   6/2017  Bi ......................... H01L 51/525
2017/0331066 A1*  11/2017  Jeon .................... H01L 51/5044

FOREIGN PATENT DOCUMENTS

| CN | 103872089 A | 6/2014 |
| CN | 104124263 A | 10/2014 |
| CN | 107910348 A | 4/2018 |
| CN | 108022961 A | 5/2018 |

OTHER PUBLICATIONS

Chinese Office Action dated Apr. 2, 2020 for corresponding Chinese Application No. 201810642650.4, including English translation thereof.

* cited by examiner

*Primary Examiner* — Robin J Mishler
(74) *Attorney, Agent, or Firm* — Tarolli, Sundheim, Covell & Tummino LLP

(57) ABSTRACT

A display panel and a display device are provided. The display panel includes a fingerprint identification area, at least one support unit, and a pixel definition layer. The fingerprint identification area includes a light-transmitting area and a non-light-transmitting area. The support unit is disposed in the light-transmitting area and the non-light-transmitting area. The pixel definition layer includes a plurality of aperture areas each exposing at least one light-emitting unit. Each aperture area has a first neighboring side adjacent to a support unit having a second neighboring side disposed opposite to the first neighboring side. The second neighboring side has an effective length that is parallel to and directly facing the first neighboring side, and the effective length is smaller than a length of the first neighboring side; or, the support unit is disposed adjacent to the first neighboring side, which is a short side of the aperture area.

23 Claims, 7 Drawing Sheets

DISPLAY PANEL AND DISPLAY DEVICE

CROSS-REFERENCE TO RELATED APPLICATIONS

The present disclosure claims priority to Chinese Patent Application No. 201810642650.4, filed on Jun. 21, 2018, the content of which is incorporated herein by reference in its entirety.

TECHNICAL FIELD

The present disclosure relates to the field of display technologies, and in particular, to a display panel and a display device.

BACKGROUND

For a display panel having fingerprint identification function, in order to better realize the full screen design and prevent the fingerprint identification area from occupying space in the non-display area, the display area can be multiplexed as the fingerprint identification area by the in-screen fingerprint technology. When the display area is multiplexed as the fingerprint identification area, a plurality of fingerprint identification units are further disposed at the position corresponding to the fingerprint identification area in the display panel. When the fingerprint identification is performed, the light emitted from the light source is reflected by the finger and enters into the fingerprint identification unit in the specific area, and then the fingerprint identification unit further identifies the valley-ridge pattern of the fingerprint corresponding to this area according to the received reflected light.

However, in the related art, since the arrangement of each layer and other components in the driving unit of the display panel is relatively compact, the light-transmitting area has a low occupied proportion on the display panel, thereby affecting the emission and entry of light, and thus affecting the sensitivity of the light sensation fingerprint identification.

SUMMARY

In view of this, the present disclosure provides a display panel and a display device. By a decentralized arrangement of the support units in the display panel, the support units are disposed in the non-transparent area as much as possible, thereby improving the effective light-transmitting area on the display panel, and thus greatly improving the overall light transmittance ratio and improving the sensitivity of the light sensation fingerprint identification.

In an aspect, the present disclosure provides a display panel, and the display panel includes a fingerprint identification area including a light-transmitting area and a non-light-transmitting area; at least one support unit disposed in the light-transmitting area and the non-light-transmitting area; and a pixel definition layer including a plurality of aperture areas each exposing at least one light-emitting unit; wherein each of the plurality of aperture areas has a first neighboring side disposed adjacent to a corresponding one of the at least one support unit, and each of the at least one support unit has a second neighboring side disposed opposite to the first neighboring side; and wherein the second neighboring side has an effective length that is parallel to and directly facing the first neighboring side, and the effective length is smaller than a length of the first neighboring side; or, each of the at least one support unit is disposed adjacent to the first neighboring side of the corresponding aperture area, and the first neighboring side is a short side of the corresponding aperture area.

In another aspect, the present disclosure provides a display device, the display device includes a display panel, and the display panel includes: a fingerprint identification area including a light-transmitting area and a non-light-transmitting area; at least one support unit disposed in the light-transmitting area and the non-light-transmitting area; and a pixel definition layer including a plurality of aperture areas each exposing at least one light-emitting unit; wherein each of the plurality of aperture areas has a first neighboring side disposed adjacent to a corresponding one of the at least one support unit, and each of the at least one support unit has a second neighboring side disposed opposite to the first neighboring side; and wherein the second neighboring side has an effective length that is parallel to and directly facing the first neighboring side, and the effective length is smaller than a length of the first neighboring side; or, each of the at least one support unit is disposed adjacent to the first neighboring side of the corresponding aperture area, and the first neighboring side is a short side of the corresponding aperture area.

BRIEF DESCRIPTION OF DRAWINGS

In order to more clearly illustrate technical solutions in embodiments of the present disclosure, the accompanying drawings used in the embodiments are briefly introduced as follows. The drawings described as follows are merely part of the embodiments of the present disclosure, other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relations, for example, A and/or B may indicate that three cases, i.e., A exists individually, A and B exist simultaneously, B exists individually. In addition, the character "/" herein generally indicates that the related objects before and after the character form an "or" relation.

It should be understood that although the support component may be described using the terms of "first", "second", "third", etc., in the embodiments of the present disclosure, the support component will not be limited to these terms. These terms are merely used to distinguish support components from one another. For example, without departing from the scope of the embodiments of the present disclosure, a first support component may also be referred to as a second support component, similarly, a second support component may also be referred to as a first support component.

Figure 1:
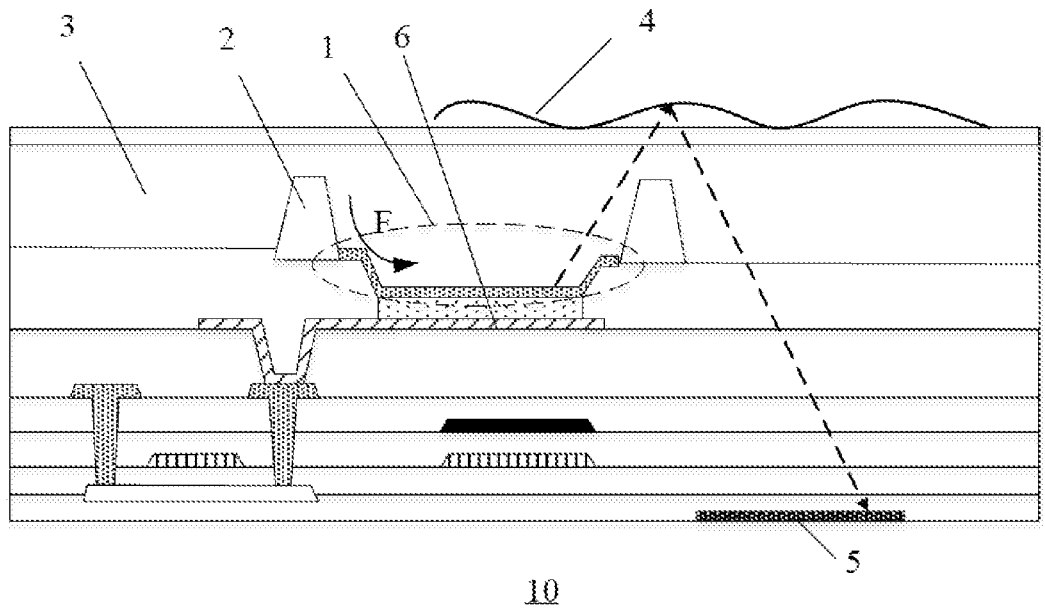
FIG. 1 is a schematic view of a display panel in the prior art.
Figure 2:
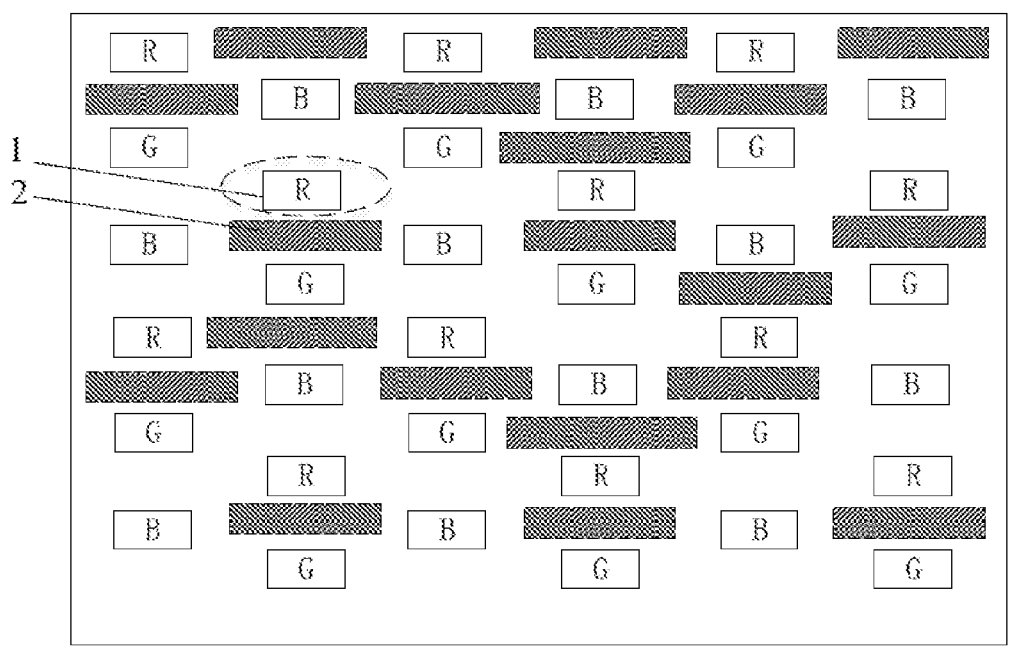
FIG. 2 is a schematic top view of the display panel of FIG. 1.

In order to further illustrate the beneficial effects of the embodiments of the present disclosure, the disadvantages in the related art are described by examples before describing the embodiments of the present disclosure. After deep research, the inventor found that some technical problems currently existing in the related art have not yet been solved with desired solutions. As shown in FIG. 1 and FIG. 2, for the OLED display panel 10 in the related art, the display panel 10 includes a light sensation fingerprint identification unit 5, a light-emitting unit, an aperture area 1 (the ellipse-shaped dotted frame shown in FIG. 1) corresponding to the light-emitting unit, a support component 2 located next to the aperture area. The light-emitting unit includes an anode 6. During the fingerprint identification process, the light emitted from the light source is reflected by a touch body 4 (such as a finger) and then enters into the light sensation fingerprint identification unit 5. Since the ridges and the valleys of the fingerprint have different distances from the light sensation fingerprint identification unit 5, the brightness of the reflected light received by the light sensation fingerprint identification unit 5 at the position of the ridges is different from the brightness of the reflected light received by the light sensation fingerprint identification unit 5 at the position of the valleys, and thus the converted light currents have different values, and then the fingerprint is identified according to the values of the converted light currents. In the related art, since the support component 2 is disposed adjacent to the aperture area 1 corresponding to the light-emitting unit, as shown in FIG. 2, the effective direct facing length between the aperture area 1 and the support component 2 is relatively long, and meanwhile, since the display panel has light sensation fingerprint identification function, the design of the support component in the related art will not consider whether it is arranged in the non-light-transmitting area or the light-transmitting area, thereby affecting the overall light transmittance ratio of the display panel, and thus causing problems such as serious light scattering when the light passes through the display panel. As a result, problems such as false identification and inaccurate identification may occur due to fingerprint signal loss, interference, and the like. In addition, in the related design, the effective direct facing length between the aperture area 1 and the support component 2 is relatively long, as shown in FIG. 2, the effective direct facing length between the aperture area 1 and the support component 2 is substantially equal to the length of the long side of the aperture area 1. When the display panel is pressed by an external force, as shown in FIG. 1, the contact area between the bottom of the support component 2 and the aperture area definition layer 3 is subjected to the external force, at this moment, the support component 2 is accordingly deformed, as a result, it may inclines toward the aperture area 1, and thus a part of the aperture area 1 is covered, and the emergent light from the light-emitting unit is block, thereby affecting the light-emitting effect and the light sensation fingerprint identification accuracy. Moreover, with further reference to FIG. 1, since the direct facing length between the aperture area 1 and the support component 2 is relatively long, when the display panel is in the anti-drop test, the support component 2 is collapsed, and the anode 6 of the light-emitting unit is subjected to the force from the support components 2 located at both ends, and thus easily causing problems such as wrinkle and breakage, thereby affecting the stability of the light-emitting unit device in the display panel.

Figure 3:
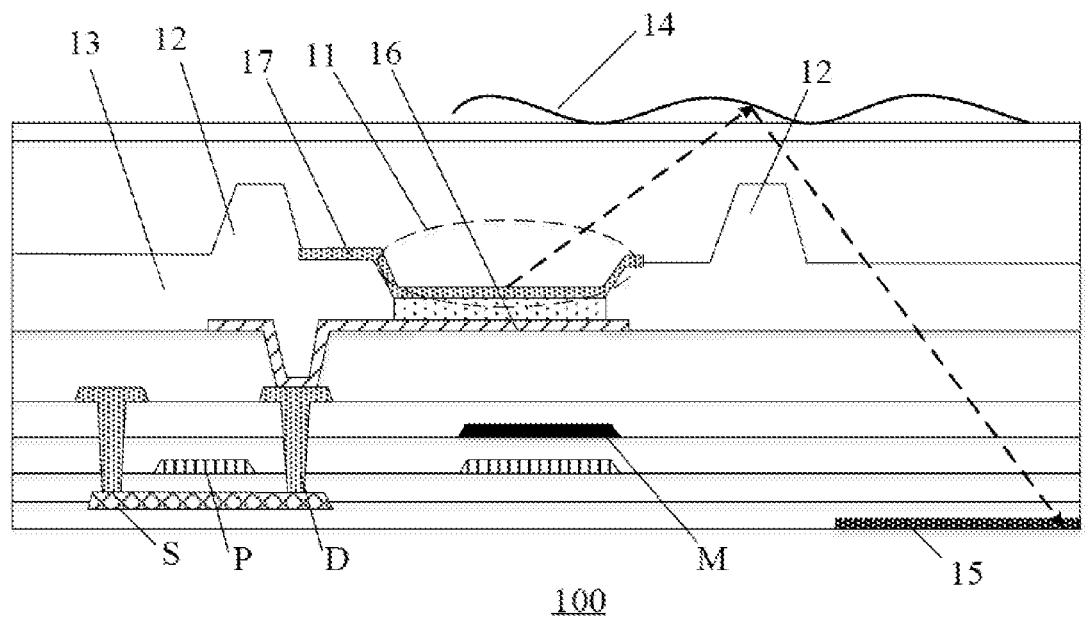
FIG. 3 is a schematic structural diagram of a display panel according to an embodiment of the present disclosure.
Figure 4:
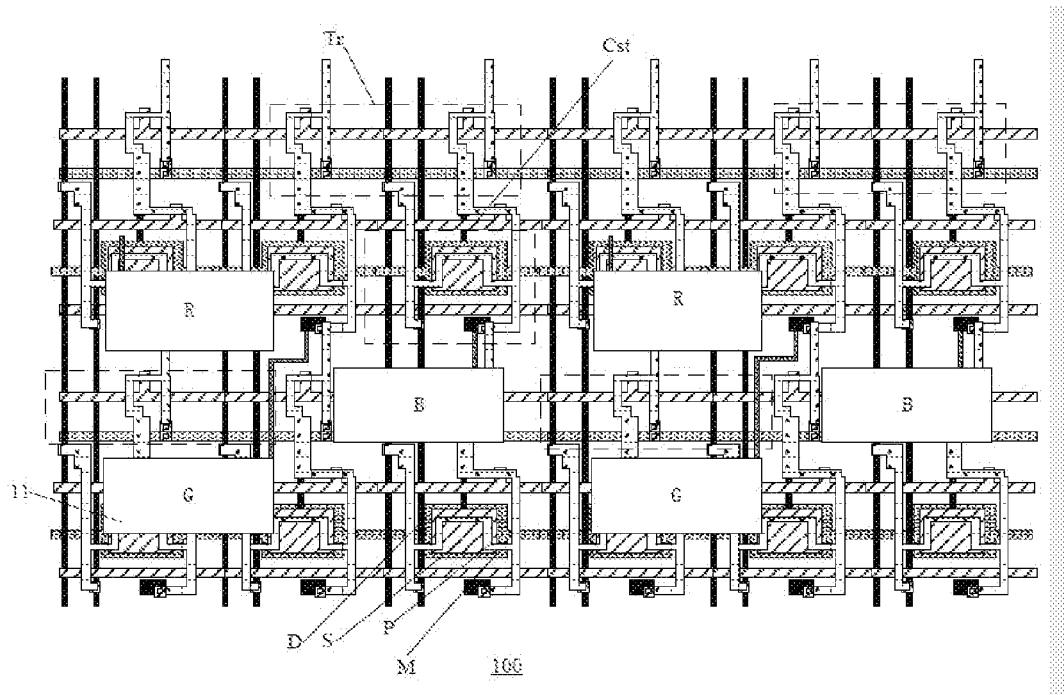
FIG. 4 is a schematic top view of the display panel of FIG. 3.
Figure 5:
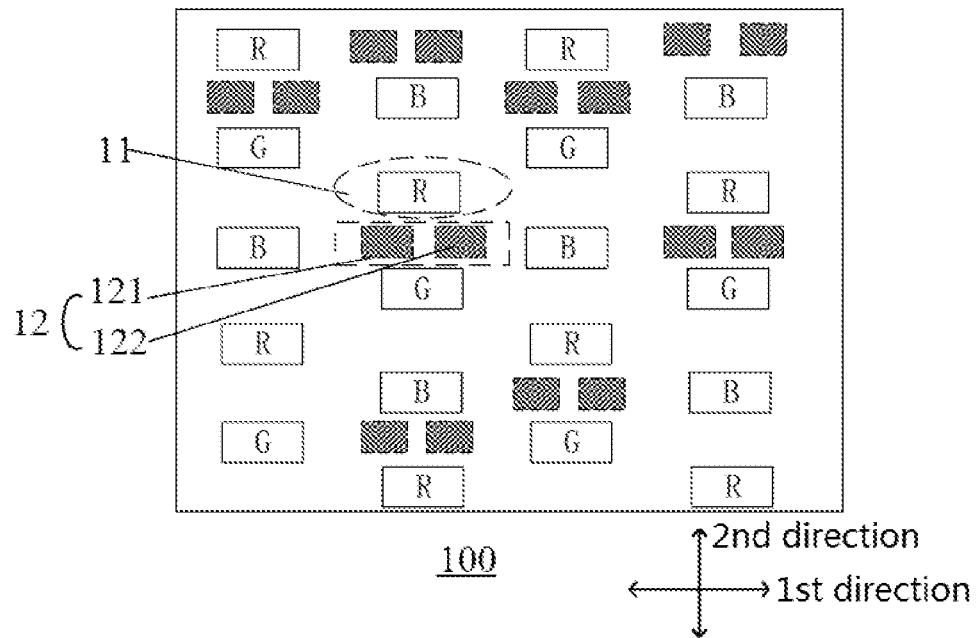
FIG. 5 is a schematic structural diagram of a display panel according to another embodiment of the present disclosure.
Figure 6:
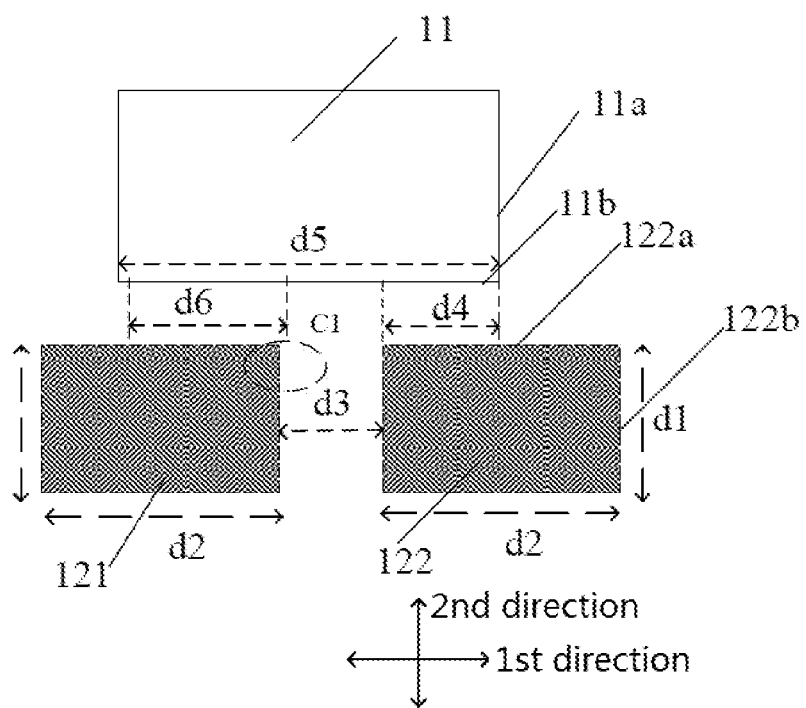
FIG. 6 is a schematic enlarged view of a local area of FIG. 5.
Figure 7:
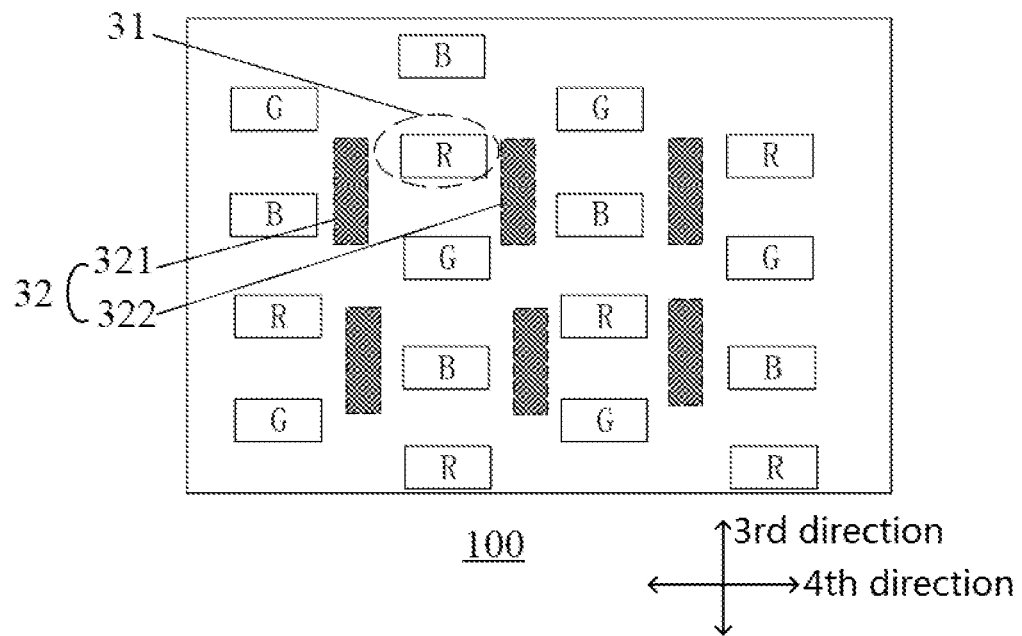
FIG. 7 is a schematic structural diagram of a display panel according to still another embodiment of the present disclosure.
Figure 8:
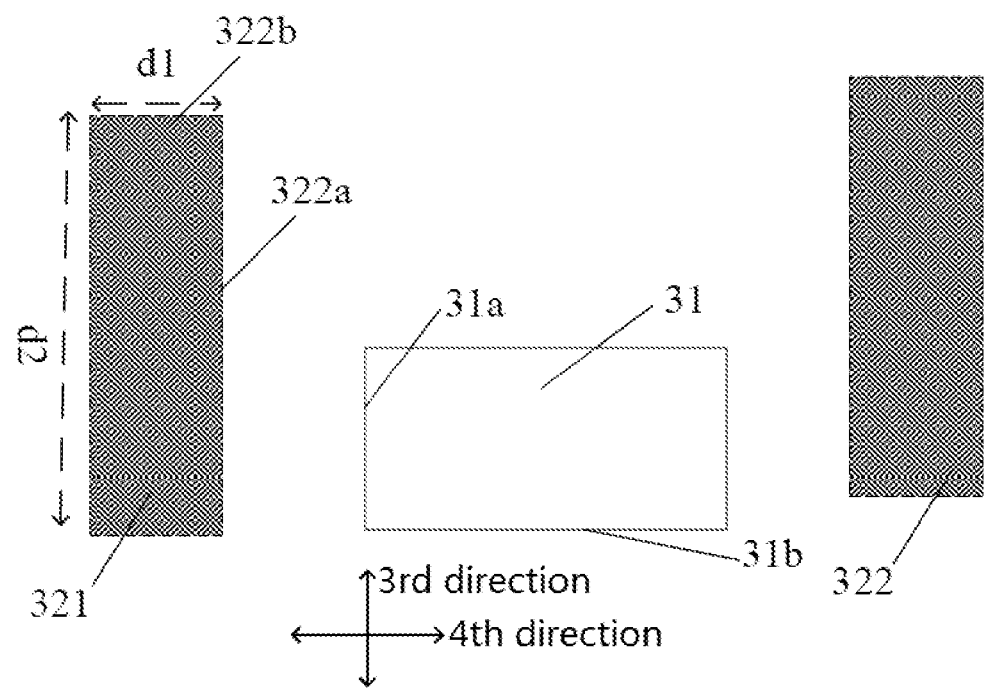
FIG. 8 is a schematic enlarged view of a local area of FIG. 7.
Figure 9:
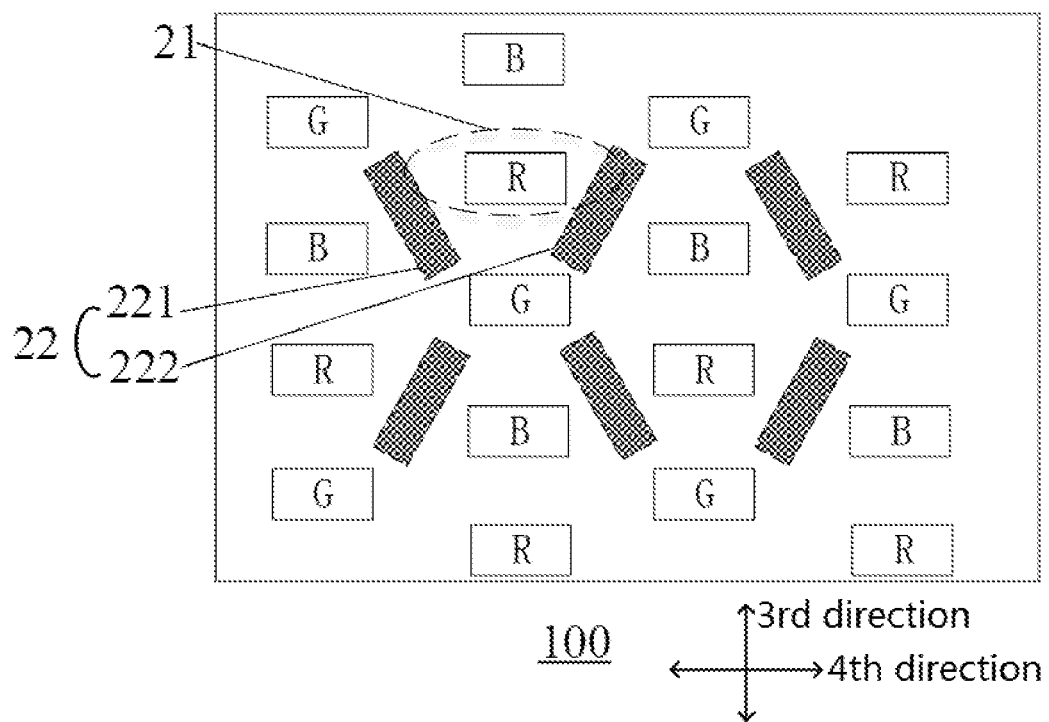
FIG. 9 is a schematic structural diagram of a display panel according to still another embodiment of the present disclosure.
Figure 10:
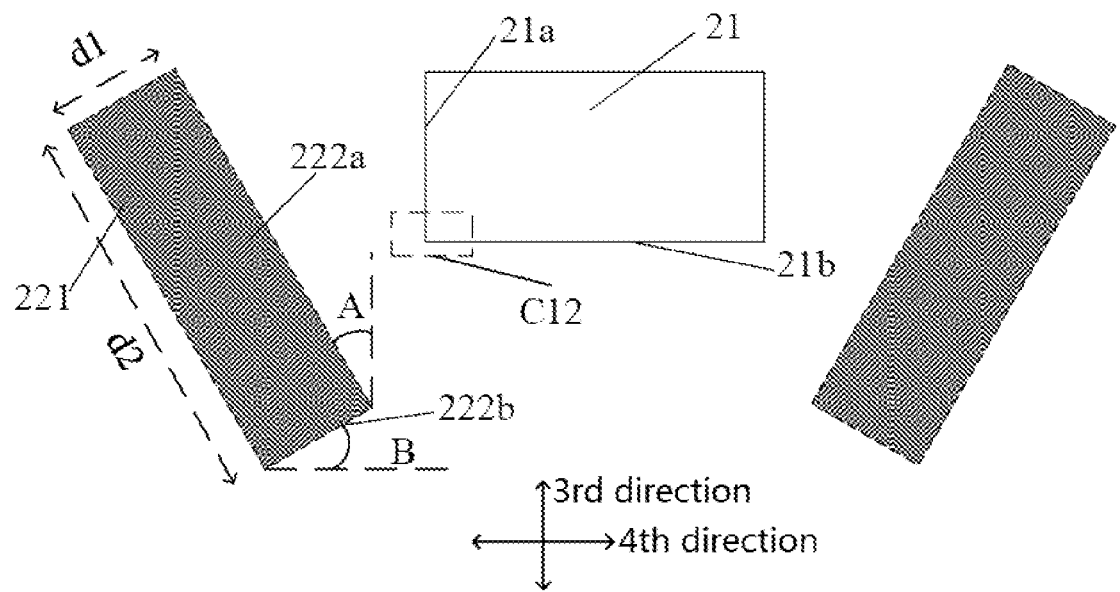
FIG. 10 is a schematic enlarged view of a local area of FIG. 9.
Figure 11:
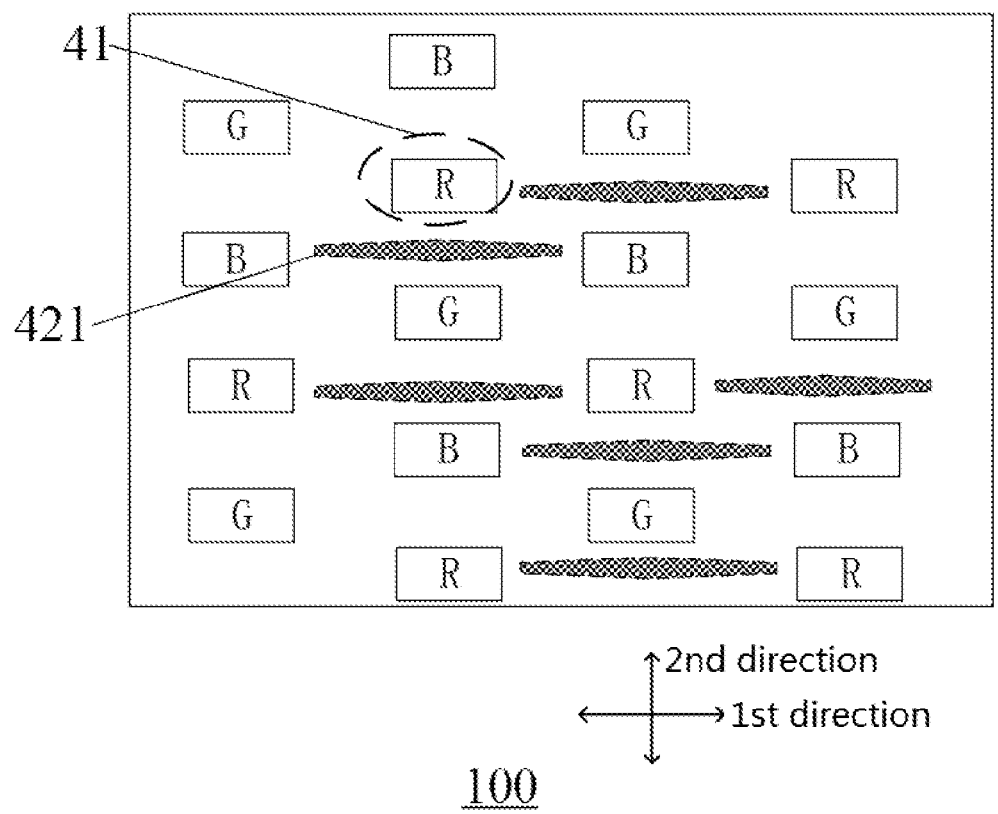
FIG. 11 is a schematic structural diagram of a display panel according to still another embodiment of the present disclosure.
Figure 12:
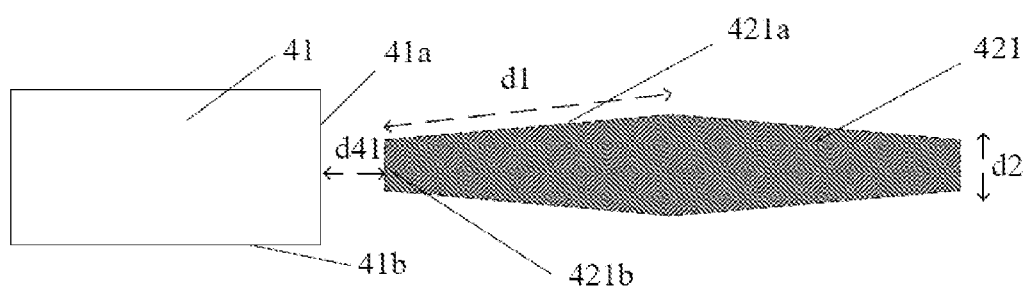
FIG. 12 is a schematic enlarged view of a local area of FIG. 11.
Figure 13:
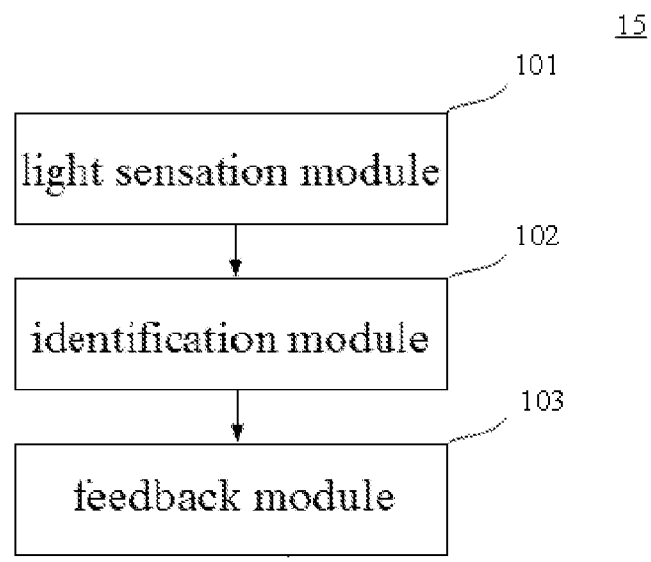
FIG. 13 is a schematic diagram showing a working process of a light sensation fingerprint identification unit 15 according to an embodiment of the present disclosure.

As for the abovementioned technical problems, as shown in FIGS. 3-13, FIG. 3 is a schematic structural diagram of a display panel according to an embodiment of the present disclosure; FIG. 4 is a schematic top view of the display panel of FIG. 3; FIG. 5 is a schematic structural diagram of a display panel according to another embodiment of the present disclosure; FIG. 6 is a schematic enlarged view of a local area of FIG. 5; FIG. 7 is a schematic structural diagram of a display panel according to still another embodiment of the present disclosure; FIG. 8 is a schematic enlarged view of a local area of FIG. 7; FIG. 9 is a schematic structural diagram of a display panel according to still another embodiment of the present disclosure; FIG. 10 is a schematic enlarged view of a local area of FIG. 9; FIG. 11 is a schematic structural diagram of a display panel according to still another embodiment of the present disclosure; FIG. 12 is a schematic enlarged view of a local area of FIG. 11; and FIG. 13 is a schematic diagram of a working process of a light sensation fingerprint identification unit 15 according to an embodiment of the present disclosure. The present disclosure provides a display panel and a display device. By a decentralized arrangement of the support units in the display panel, the support units are disposed in the non-transparent area as much as possible, thereby improving the effective light-transmitting area on the display panel, and thus greatly improving the overall light transmittance ratio and improving the sensitivity of the light sensation fingerprint identification.

As shown in FIGS. 3-13, an embodiment of the present disclosure provides a display panel 100. The display panel includes a fingerprint identification area (i.e., the area corresponding to the light sensation fingerprint identification unit 15). The fingerprint identification area includes a light-transmitting area Tr (the dashed frame shown in FIG. 4) and a non-light-transmitting area (not shown). As shown in FIG. 3 and FIG. 4, FIG. 4 illustrates the driving array substrate and part of the light-emitting units R/G/B in the display panel 100, and the aperture area 11 defining the light-emitting units R/G/B. It should be noted that the light-transmitting area Tr in this embodiment of the present disclosure refers to an area on the driving array substrate where the light can be transmitted through, as shown in the dotted frame shown in FIG. 4, the metal lines within the light-transmitting area Tr (the metal lines refers to various metal functional lines on the driving array substrate, such as the PVDD line, the scanning line, the data line, the light-emitting control signal line, etc. As shown in FIGS. 3-4, the display panel is provided with the gate line S, the data line D, the semiconductor layer P, and an electrode plate M of a capacitor. If the TFT is taken as an example, then it includes the gate S, the source-drain D, and the semiconductor layer P.) are sparsely arranged. The metal lines are spaced apart from one another, such that the light passes through the light-transmitting are Tr and then enters into the light sensation fingerprint identification unit 15 after being reflected by the touch body 14 (such as a finger). In addition, the non-light-transmitting area mainly refers to the area where the metal lines are densely arranged and the overlapping degree between the layers is high, since metal lines located in different layers overlap each other, the light cannot be transmitted, such as the capacitor Cst (the dotted frame shown in FIG. 4) and the light-emitting units R/G/B on the driving array substrate as shown in FIG. 4. It should be noted that the support unit 12 is not illustrated in FIG. 4. In this embodiment of the present disclosure, the support units 12 are arranged as much as possible in the non-light-transmitting area, but considering the overall design of the display panel 100, part of the support units will be arranged in the light-transmitting area. In the light-transmitting area Tr, the support units 12 have a first total cross-sectional area S1, and the first total cross-sectional area S1 accounts for approximately 15%-24% of the total area of the light-transmitting area Tr. It should be noted that the first total cross-sectional area S1 of the support units 12 refers to the sum of the bottom cross-sectional areas of all the support units 12 within the light-transmitting area Tr of the display panel 100, and the total area of the light-transmitting area refers to the sum of the areas of all the light-transmitting areas of the display panel 100. Meanwhile, the number and the area proportion of the support units 12 in the non-light-transmitting area are much larger than that in the light-transmitting area Tr.

The support units 12 have a second total cross-sectional area S2, and the second total cross-sectional area S2 refers to the sum of the bottom cross-sectional areas of all the support units 12 within the non-light-transmitting area of the display panel 100. The total area of the non-light-transmitting area refers to the sum of the areas of all the non-light-transmitting areas of the display panel 100. The ratio of the second total cross-sectional area S2 of the support units 12 to the total area of the non-light-transmitting area in the non-light area is larger than the ratio of the first total cross-sectional area S1 to the total area of the light-transmitting area Tr.

In an embodiment of the present disclosure, the support units 12 are arranged as much as possible in the non-light-transmitting area, thereby reducing the adverse effect of the support units 12 on the light, such as the blocking effect or absorbing effect to the light. In the light-transmitting area Tr, the support units only occupy 15%-24% of the total area of the light-transmitting area, which greatly improves the effective light transmittance ratio of the light-transmitting area. In addition, in order to further improve the effective light transmittance ratio of the light-transmitting area, in this embodiment of the present disclosure, the support unit may be formed by a light-transmitting material, such as a high polymer organic material.

As shown in FIG. 3 and FIG. 4, FIG. 4 is merely a schematic diagram and does not represent the specific structure of an actual product.

In an embodiment of the present disclosure, the display panel 100 includes a plurality of support units 12. In the fingerprint identification area, the support units 12 are disposed in both the light-transmitting area Tr and the non-light-transmitting area. In addition, the display panel includes a pixel definition layer 13, and the pixel definition layer 13 includes an aperture area 11 (the ellipse-shaped dotted frame shown in FIG. 3) exposing the light-emitting unit. It should be noted that the light-emitting unit includes an anode 16 correspondingly connected to the driving array substrate, a cathode 17 in a planar shape covering the entire display panel 100, and an organic light-emitting layer disposed between the anode 16 and the cathode 17. In this embodiment of the present disclosure, the anode 16 is an opaque total reflection metal overlapping structure, so the position where the anode 16 is located can be regarded as a non-light-transmitting area. The cathode 17 is a transparent and light-transmitting electrode layer which, as a whole layer, covers the light-transmitting area Tr and the non-light-transmitting area of the display panel 100, so that the overall light transmittance ratio of the display panel is within a range of 4%-6%. It should be noted that the overall light transmittance ratio of the display panel is a concept of an average value, including an integrated light transmittance ratio of the non-light-transmitting area and the light-transmitting area of the display panel. In general, the overall light transmittance ratio of the display panel should be larger than 1%, so as to realize the light sensation fingerprint identification function.

In an embodiment of the present disclosure, the display panel further includes a light sensation fingerprint identification unit 15. The implementation process of the light-sensitive fingerprint identification function of the display panel is roughly described as follows: during the fingerprint identification process, the light emitted from the light source reaches the touch body 14 (such as a finger), and then the light is reflected by the touch body 14 (such as a finger), and then the reflected light reaches the light sensation fingerprint identification unit 15 in the display panel 100, and then the light sensation fingerprint identification unit 15 determines the valley(s) and ridge(s) of the fingerprint based on the received light, so as to realize fingerprint identification for the user.

As shown in FIG. 13, FIG. 13 is a schematic diagram of a working process of a light sensation fingerprint identification unit 15 according to an embodiment of the present disclosure. The light sensation fingerprint identification unit 15 includes a light sensing module 101, an identification module 102 and a feedback module 103. During the fingerprint identification process, the light emitted from the light source reaches the touch body 14, and then the touch body 14 reflects the light to form reflected light, and then the reflected light reaches the light sensing module 101, the light sensing module 101 is used to sense the received light, and the identification module 102 is electrically connected to the light sensing module 101 for identifying the valley(s) and ridge(s) of the fingerprint according to the light received by the light sensing module 101; the feedback module 103 is used to feed back the fingerprint result identified by the identification module 102 to a driving chip (not show), so as to perform corresponding operations.

With further reference to FIG. 3 and FIG. 4, it should be noted that, during the fingerprint identification process, an external light source may be disposed on the display panel 100 to serve as the light source for the fingerprint identification unit 15, or it is also possible to use each light-emitting unit in the display panel 100 for normal display to serve as the light source for the fingerprint identification unit. In the red light-emitting unit R, the green light-emitting unit G, and the blue light-emitting unit B, since the green light emitted from the green light-emitting unit G has a high brightness and the green light-emitting unit G has a slow decay in its service life, when each light-emitting unit in the display panel is used as the light source for the fingerprint identification unit 15, an embodiment of the present disclosure selects the green light-emitting unit G as a main light source for the fingerprint identification unit 15, and at the same time, the blue light-emitting unit B serves as an auxiliary light source.

With further reference to FIG. 3 and FIG. 4, in an embodiment of the present disclosure, the display panel 100 further includes a pixel definition layer 13, and the pixel definition layer 13 further includes an aperture area 11 exposing the light-emitting unit. It should be noted that the support unit 12 is disposed on the pixel definition layer 13, and the support unit 12 and the pixel definition layer 13 may be formed by a same organic high polymer material. In addition, in order to achieve the mechanical strength of the display panel 100 and avoid the problem such as wrinkle of the anode 16 caused by the pressing of an external force, in an embodiment of the present disclosure, by matching the thickness of the pixel definition layer 13 and the support unit 12, the thickness of the pixel definition layer 13 is designed as 1 μm-1.5 μm and the thickness of the support unit 12 is designed as 1.5 μm-2 μm, so that the path of the external force to the anode 16 has a relatively long distance and thus the stress is buffered, so as to protect the anode 16 from damage caused by punching from the external force.

In addition, the aperture area 11 includes a first neighboring side adjacent to the corresponding support unit 12. The support unit 12 includes a second neighboring side disposed opposite to the first neighboring side. The second neighboring side has an effective length that is parallel to and directly facing the first neighboring side, and the effective length is smaller the length of the first neighboring side. Or, the support unit is disposed adjacent to the first neighboring side of the aperture area, and the first neighboring side is the short side of the aperture area. The details will be accordingly described in the following.

As shown in FIGS. 3-6, an embodiment of the present disclosure provides a display panel 100 including a plurality of aperture areas 11 and support units 12.

The aperture areas 11 define a plurality of light-emitting units R/G/B, that is, red light-emitting unit(s), green light-emitting unit(s), and blue light-emitting unit(s), respectively. The aperture areas 11 include green aperture area(s) corresponding to the green light-emitting unit(s) G, red aperture area(s) corresponding to the red light-emitting unit(s) R, and blue aperture area(s) corresponding to the blue light-emitting unit(s) B.

The support units include a plurality of first support sets 12, and each first support set 12 includes at least two first support components disposed adjacently. As shown in FIG. 5, the first support component set 12 includes a first support component 121 and a first support component 122 disposed adjacent to each other.

With further reference to FIG. 6 (FIG. 6 is a schematic enlarged view of a local area of FIG. 5), the first support component 121/122 has a first long side 122a (having a side length d2) extending in a first direction and a first short side 122b (having a side length d1) extending along a second direction. The ratio of the side length d2 of the first long side 122a to the side length d1 of the first short side 122b is within a range of (1:1)-(1.3:1). In this embodiment, with this ratio of the long side to the short side of the first support component, the first support component can be disposed in the non-light-transmitting area as much as possible, thereby improving the light transmittance ratio of the entire display panel 100. The first support component 121/122 has a first total cross-sectional area in the light-transmitting area Tr accounting for approximately 19%-20% of the total area of the light-transmitting area Tr, and thus the occupied proportion in the light-transmitting area is relatively small.

In order to achieve the mechanical support function of the support unit in the display panel 100, in an embodiment of the present disclosure, by providing two decentralized first support units 121/122, the mechanical support function and the small occupied proportion in the light-transmitting area can be achieved. With further reference to FIG. 6, there is a first distance d3 between two adjacent first support components 121/122, and the length of the first distance d3 is smaller the length of the short side d1 of the first support component. In this way, the mechanical strength of the support unit 12 can be achieved, and the deformation of the encapsulation layer or the glass or the flexible encapsulation layer located outside the light-emitting unit can be prevented from being damaged when the display panel is subjected to an external force.

Further, in an embodiment of the present disclosure, each aperture area 11 is disposed at least adjacent to one first support set 12. The cross-sectional area S12 of the first support component 121/122 is smaller than the cross-sectional area S11 of the aperture area 11. Further, as shown in FIG. 6, in an embodiment of the present disclosure, the aperture area 11 has a rectangular profile and has a long side 11b and a short side 11a. The first neighboring side of the aperture area 11 adjacent to the corresponding first support component 121/122 is the long side 11b. The second neighboring side of the first support component 121/122 disposed opposite to the first neighboring side 11b is the first long side 122a. The second neighboring side 122a has an effective length (d4+d6) that is parallel to and directly facing the first neighboring side 11b. The effective length (d4+d6) is smaller the length d5 of the first neighboring side 11b. In addition, the edge area C1 of the first support component 121/122 is disposed adjacent to the first neighboring side 11b of the aperture area 11.

Compared with the related art, in an embodiment of the present disclosure, by a decentralized arrangement of the support units, the effective direct facing side length between the aperture area and the support units is reduced, thereby reducing the "danger area" of the aperture area, and the danger area is the area where the support component is prone to collapse or be deformed to adversely affect the aperture area.

With further reference to FIG. 5, in light-emitting units having different colors, the arrangements of the first support components are different. In the first direction, there is no first support component between two adjacent green aperture areas, and the main reason for this arrangement is that the aperture area 11 of the green light-emitting unit G in the display panel 100 is generally smaller than that of the red light-emitting unit R and the blue light-emitting unit B, and in order to achieve uniformity of the overall light transmittance ratio, there is no first support component 121/122 between two adjacent green aperture areas. In addition, in the area where the aperture area 11 of the green light-emitting unit G is located, there are less the metal lines arranged, and in order to more effectively improve the light transmittance ratio, in this embodiment of the present disclosure, there is no first support component 121/122 between two adjacent green aperture areas.

In addition, in the first direction, at least one first support set 12 is disposed between two adjacent blue aperture areas, and at least one first support set 12 is disposed between two adjacent red aperture areas.

As shown in FIG. 3, FIG. 4, FIG. 7 and FIG. 8, an embodiment of the present disclosure provides a display panel 100 including a plurality of aperture areas 31 and support units. The aperture areas 31 define a plurality of light-emitting units R/G/B, that is, red light-emitting unit(s), green light-emitting unit(s), and blue light-emitting unit(s), respectively.

The support units include a plurality of second support sets 32, and each second support set 32 includes at least two second support components arranged in mirror symmetry. As shown in FIG. 7, each second support set 32 includes a second support component 321 and a second support component 322 that are arranged in mirror symmetry.

With further reference to FIG. 8 (FIG. 8 is a schematic enlarged view of a local area of FIG. 7), the second support component 321/322 has a second long side 322a (having a side length d2) extending in a third direction and a second short side 322b (having a side length d1) extending along a fourth direction. The ratio of the side length d2 of the second long side 322a to the side length d1 of the second short side 322b is within a range of (2:1)-(4:1). In this embodiment, with this ratio of the long side to the short side of the second support component, the second support component can be disposed in the non-light-transmitting area as much as possible, thereby improving the light transmittance ratio of the entire display panel 100. The second support component 321/322 has a total cross-sectional area in the light-transmitting area Tr accounting for approximately 22%-25% of the total area of the light-transmitting area Tr, and thus the occupied proportion in the light-transmitting area is relatively small.

With further reference to FIGS. 7-8, in an embodiment of the present disclosure, each aperture area 31 is disposed at least adjacent to one second support set 32, and the second support component 321/322 has a cross-sectional area S32 that is not smaller than the cross-sectional area S31 of the aperture area 31.

In addition, as shown in FIG. 8, in an embodiment of the present disclosure, the aperture area 31 has an approximately rectangular shape with a long side 31b and a short side 31a. The short side 31a extends along the third direction, and the long side 31b of the aperture area 31 extends along the fourth direction. The third direction is approximately perpendicular to the fourth direction. The second long side 322a of the second support component 321 extends along the third direction. The second short side 322b of the second support component 321 extends along the fourth direction. The second support component 321 is disposed approximately parallel to the corresponding aperture area 31. The second long side 322a of the second support component 321 is disposed adjacent to the short side 31a of the aperture area 31.

The first neighboring side of the aperture area 31 adjacent to the corresponding second support component 321/322 is the short side 31a. The second neighboring side of the second support component 321/322 disposed opposite to the first neighboring side 31a is the second long side 322a.

Compared with the related art, in an embodiment of the present disclosure, by disposing the support unit adjacent to the first neighboring side of the aperture area, and the first neighboring side being the short side of the aperture area, the effective direct facing side length between the aperture area and the support unit is reduced. Here, the maximum side length of the effective direct facing sides between the aperture area and the support unit is the short side length of the aperture area, and thus the "danger area" of the aperture area is reduced.

Based on the above embodiments, the present disclosure also provides another embodiment.

As shown in FIG. 3, FIG. 4, FIG. 9 and FIG. 10, an embodiment of the present disclosure provides a display panel 100 including a plurality of aperture areas 21 and support units 22. The aperture areas 21 define a plurality of light-emitting units R/G/B, that is, red light-emitting unit(s) R, green light-emitting unit(s) G, and blue light-emitting unit(s) B, respectively.

The support units 22 include a plurality of second support sets 22, and each second support set 22 includes at least two second support components arranged in mirror symmetry. As shown in FIG. 9, each second support set 22 includes a second support component 221 and a second support component 222 that are arranged in mirror symmetry.

With further reference to FIG. 10 (FIG. 10 is a schematic enlarged view of a local area of FIG. 9), the second support component 221/222 has a second long side 222a (having a side length d2) and a second short side 222b (having a side length d1). The ratio of the side length d2 of the second long side 222a to the side length d1 of the second short side 222b is within a range of (2:1)-(4:1). In this embodiment, with this ratio of the long side to the short side of the second support component, the second support component can be disposed in the non-light-transmitting area as much as possible, thereby improving the light transmittance ratio of the entire display panel 100. The second support component 221/222 has a total cross-sectional area in the light-transmitting area Tr accounting for approximately 19%-22% of the total area of the light-transmitting area Tr, and thus the occupying proportion in the light-transmitting area is relatively small.

With further reference to FIGS. 9-10, in an embodiment of the present disclosure, each aperture area 21 is disposed at least adjacent to one second support set 22, and the second support component 221/222 has a cross-sectional area S22 that is not smaller than the cross-sectional area S21 of the aperture area 21.

In addition, as shown in FIG. 10, in an embodiment of the present disclosure, the aperture area 21 has an approximately rectangular shape with a long side 21b and a short side 21a. The short side 21a extends along the third direction, and the long side 21b of the aperture area 31 extends along the fourth direction.

The second support component 221 has a substantially rectangular cross section. The extending direction of the second long side 222a of the second support component 221 forms a third angle A with the third direction, and the third angle A is within a range of 15°-60°. The extending direction of the second short side 222b of the second support component 221 forms a fourth angle B with the fourth direction, and the fourth angle is within a range of 15°-45°. In an embodiment of the present disclosure, an angle area C12 (the dotted frame shown in FIG. 10) formed by the short side 21a of the aperture area 21 and the long side 21b of the aperture area 21 is adjacent to the second support component 221. In addition, the second long side 222a of the second support component 221 is disposed adjacent to the short side 21a of the aperture area 21. It has been found through experiments that the support unit is placed in the non-light-transmitting area as much as possible after rotating the support unit by a certain angle, thereby improving the light transmittance ratio of the display panel. At the same time, by placing the support unit adjacent to the angle area of the aperture area of the light-emitting unit, the second support component 221 and the aperture area have no parallel and direct facing sides, but only directly facing corners. Therefore, the effective length is almost zero, that is, there is almost no "danger area", so when the support unit is subjected to an external force, the influence on the light-emitting unit in the aperture area can be greatly reduced.

Based on the above embodiments, the present disclosure also provides another embodiment.

As shown in FIG. 3, FIG. 4, FIG. 11 and FIG. 12, an embodiment of the present disclosure provides a display panel 100 including a plurality of aperture areas 41 and support units 42. The aperture areas 41 define a plurality of light-emitting units R/G/B, that is, red light-emitting unit(s) R, green light-emitting unit(s) G, and blue light-emitting unit(s) B, respectively.

As shown in FIG. 11, the support units include a plurality of third support sets, and each third support set includes at least one third support component 421.

With further reference to FIG. 12 (FIG. 12 is a schematic enlarged view of a local area of FIG. 11), the third support component 421 has four third long sides 421a (having a side length d1) and two oppositely disposed third short sides 421b (having a side length d2). The ratio of the side length d1 of the third long side 421a to the side length d2 of the third short side 421b is within a range of (2:1)-(4:1). The third support component 421 has a hexagonal profile. In this embodiment, with this ratio of the long side to the short side of the third support component, the third support component can be disposed in the non-light-transmitting area as much as possible, thereby improving the light transmittance ratio of the entire display panel 100. The third support component 421 has a total cross-sectional area in the light-transmitting area Tr accounting for approximately 16%-18% of the total area of the light-transmitting area Tr, and thus the occupied proportion in the light-transmitting area is relatively small.

With further reference to FIG. 12, in an embodiment of the present disclosure, the third short side 421b of the third support component 421 is disposed adjacent to the short side 41a of the aperture area 41, and the aperture area 41 further has a long side 41b.

The first neighboring side of the aperture area 41 adjacent to the corresponding third support component 421 is the short side 41a. The second neighboring side of the third support component 421 disposed opposite to the first neighboring side 41a is the third short side 421b. There is a distance d41 between the first neighboring side and the second neighboring side. Compared with the related art, in an embodiment of the present disclosure, by disposing the short side of the support unit adjacent to the first neighboring side of the aperture area, and the first neighboring side being the short side of the aperture area, the effective direct facing side length between the aperture area and the support unit is reduced. Here, the maximum side length of the effective direct facing sides between the aperture area and the support unit is the short side length of the aperture area, and thus the "danger area" of the aperture area is reduced. In addition, the experiment proves that, by disposing the angle area formed by the support unit (such as the edge area formed by the long side and the short side of the support unit 421 in FIG. 12) to be adjacent to the aperture area of the light-emitting unit, when the support unit is subjected to an external force, the influence on the light-emitting unit in the aperture area can be greatly reduced.

Figure 14:
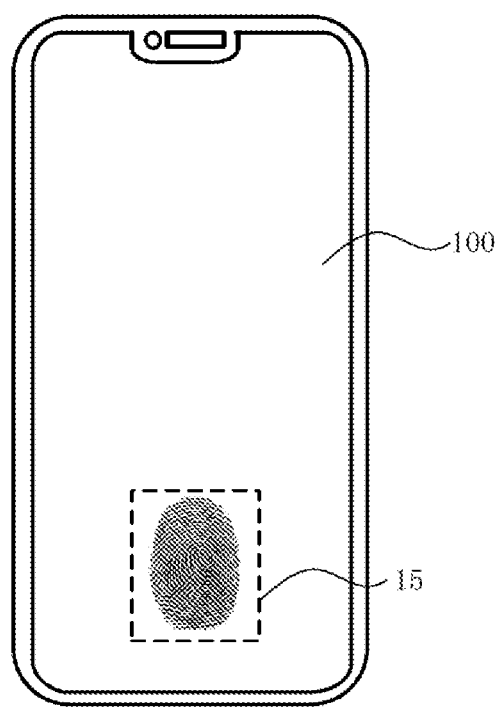
FIG. 14 is a schematic structural diagram of a display device according to an embodiment of the present disclosure.

With further reference to FIG. 11 in light-emitting units having different colors, the arrangements of the third support components are different. In the first direction, there is no third support component between two adjacent green aperture areas, and the main reason for this arrangement is that the aperture area 41 of the green light-emitting unit G in the display panel 100 is generally smaller than that of the red light-emitting unit R and the blue light-emitting unit B, and in order to achieve uniformity of the overall light transmittance ratio, there is no third support component 421 between two adjacent green aperture areas. In addition, in the area where the aperture area 41 of the green light-emitting unit G is located, there are less metal lines, and in order to more effectively improve the light transmittance ratio, in this embodiment of the present disclosure, there is no third support component 421 between two adjacent green aperture areas. In the first direction, at least one third support component 421 is arranged between two adjacent blue aperture areas, and at least one third support component 421 is arranged between two adjacent red aperture areas The present disclosure further provides a display device. As shown in FIG. 14, FIG. 14 is a schematic structural diagram of a display device according to an embodiment of the present disclosure. The display device includes the abovementioned display panel 100 and a light sensation identification unit 15 that is disposed on the display panel 100. The structure of the display panel 100 has been described in details in the above embodiments and will not be further described herein. Of course, the display device shown in FIG. 13 is merely illustrative, and the display device may be any electronic device having a display function, such as a cellphone, a tablet computer, a laptop computer, an electronic paper book, or a television.

The display device provided by the embodiment of the present disclosure includes the abovementioned display panel, therefore, with the display device, based on the arrangement of the support unit and the aperture area in the display panel, the support unit is disposed in the non-light-transmitting area as much as possible, thereby increasing the effective light-transmitting area on the display panel, and thus greatly improving the overall light transmittance ratio and improving the sensitivity of the light sensation fingerprint identification.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:
1. A display panel, comprising:
   a fingerprint identification area comprising a light-transmitting area and a non-light-transmitting area;
   a plurality of support units disposed in the light-transmitting area and the non-light-transmitting area; and a pixel definition layer comprising a plurality of aperture areas each exposing at least one light-emitting unit, wherein each support unit of the plurality of support units is disposed between two long sides of two adjacent aperture areas of the plurality of aperture areas, the two long sides are adjacent and opposite to each other, the support unit has two opposite sides that are adjacent to the two long sides, respectively, and each of the two long sides directly faces at least one support unit of the plurality of support units, wherein each side of the two opposite sides has an effective length that is parallel to and directly facing one of the two long sides adjacent thereto, the at least one support unit has a total effective length that is parallel and directly facing the long side, and the total effective length is smaller than a length of the long side; or wherein the plurality of aperture areas is arranged in a plurality of columns, each aperture area in each column of the plurality of columns has short sides facing towards other columns of the plurality of columns, each single support unit of the plurality of support units is continuous and disposed in a region between two adjacent columns of the plurality of columns and has two long sides facing towards the short sides of the adjacent apertures the two adjacent columns, respectively, wherein each of the two long sides of a support unit that is between the two adjacent column and is directly adjacent to an aperture area in the two adjacent columns is longer than one of the short sides of the aperture area directly adjacent to the long side, and each side of the single support unit is inclined at an angle relative to one of the short sides of any aperture area in the two adjacent columns directly adjacent to the single support unit.

2. The display panel according to claim 1, further comprising a transparent electrode layer, wherein the transparent electrode layer overlaps the light-transmitting area, and a light transmittance ratio of the display panel is within a range of 4%-6%.

3. The display panel according to claim 1, wherein the plurality of support units is disposed on the pixel definition layer, the pixel definition layer has a thickness within a range of 1 µm-1.5 µm, and each of the at least one support unit has a thickness within a range of 1.5 µm-2 µm.

4. The display panel according to claim 1, wherein in the light-transmitting area, the plurality of support units has a first total cross-sectional area, and the first total cross-sectional area accounts for approximately 15%-24% of a total area of the light-transmitting area.

5. The display panel according to claim 4, wherein in the non-light-transmitting area, the plurality of support units has a second total cross-sectional area, and a ratio of the second total cross-sectional area to a total area of the non-light-transmitting area is larger than a ratio of the first total cross-sectional area to the total area of the light-transmitting area.

6. The display panel according to claim 1, wherein the at least one support unit comprises two support units, the two support units are adjacently disposed and sequentially arranged along an extending direction of the long side, and each of the two support units has two opposite first sides that are adjacent to the two long sides, respectively, wherein each of the two opposite sides of each of the two support units is a first long side, the first long side extending along a first direction, each of the two support units further has a first short side extending along a second direction, and a ratio of the first long side to the first short side is within a range of 1:1-1.3:1.

7. The display panel according to claim 6, wherein there is a first distance in the second direction between the two support units, and the first distance has a length smaller than a length of the first short side of the first support unit.

8. The display panel according to claim 7, further comprising at least one red light-emitting unit, at least one green light-emitting unit, and at least one blue light-emitting unit;

wherein the plurality of aperture areas comprises at least one green aperture area corresponding to the at least one green light-emitting unit, at least one red aperture area corresponding to the at least one red light-emitting unit, and at least one blue aperture area corresponding to the at least one blue light-emitting unit; and wherein in the first direction, no support unit is arranged between two adjacent green aperture areas, at least one support unit is arranged between two adjacent red aperture areas, and at least one support unit is arranged between two adjacent blue aperture areas.

9. The display panel according to claim 6, wherein each aperture area is disposed adjacent to at least two support units of the plurality of support units, and each of the at least two support units has a cross-sectional area smaller than an area of the aperture area.

10. The display panel according to claim 4, wherein the first total cross-sectional area accounts for approximately 19%-20% of a total area of the light-transmitting area.

11. The display panel according to claim 1, wherein each support unit arranged adjacent to one side of one column of the plurality of columns is in mirror symmetry with another support unit arranged adjacent to the other side of the one column about one aperture area in the one column; and wherein each of the two long sides is a second long side, the single support unit further has a second short side, and a ratio of the second long side to the second short side is within a range of 2:1-4:1.

12. The display panel according to claim 11, wherein each aperture area in the one column is disposed adjacent to at least two support units respectively on two sides of the one column.

13. The display panel according to claim 12, wherein the short side of the aperture area extends along a third direction, and a long side of the aperture area extends along a fourth direction; the third direction is approximately perpendicular to the fourth direction; and the aperture area has an approximately rectangular profile.

14. The display panel according to claim 13,
wherein the support unit has a cross-sectional area not smaller than an area of the aperture area.

15. The display panel according to claim 14, wherein the support unit has a cross-sectional area accounting for approximately 22%-25% of a total area of the light-transmitting area.

16. The display panel according to claim 15, wherein the support unit has a substantially rectangular cross section;

an extending direction of the second long side of the support unit forms a third angle with the third direction, and the third angle is within a range of 15°-60°;

an extending direction of the second short side of the support unit forms a fourth angle with the fourth direction, and the fourth angle is within a range of 15°-45°; and an angle area formed by the short side of the aperture area and the long side of the aperture area is close to the support unit.

17. The display panel according to claim 16, wherein the support unit has a cross-sectional area accounting for approximately 19%-22% of the total area of the light-transmitting area.

18. The display panel according to claim 1,
wherein the support unit disposed between two long sides of two adjacent aperture areas of the plurality of aperture areas has a hexagonal profile with four third long sides and two oppositely disposed third short sides, a ratio of the third long side to the third short side is within a range of 2:1-4:1, every two adjacent third long sides of the four third long sides form a corner that is adjacent to one of the two long sides, and the two oppositely disposed third short sides face towards short sides of another two aperture areas of the plurality of aperture areas, respectively.

19. The display panel according to claim 18, wherein the third short side of the support unit is disposed close to the aperture area.

20. The display panel according to claim 19, further comprising at least one red light-emitting unit, at least one green light-emitting unit, and at least one blue light-emitting unit;
wherein the plurality of aperture areas comprises at least one green aperture area corresponding to the at least one green light-emitting unit, at least one red aperture area corresponding to the at least one red light-emitting unit, and at least one blue aperture area corresponding to the at least one blue light-emitting unit; and
wherein in the first direction, no support unit of the plurality of support units is arranged between two adjacent green aperture areas, at least one support unit of the plurality of support units is arranged between two adjacent red aperture areas, and at least one support unit of the plurality of support units is arranged between two adjacent blue aperture areas.

21. The display panel according to claim 20, wherein the support unit has a cross-sectional area accounting for approximately 16%-18% of a total area of the light-transmitting area.

22. The display panel according to claim 1, wherein the display panel further comprises a light sensation fingerprint identification unit, and the light sensation fingerprint identification unit comprises a light sensing module, an identification module and a feedback module;
wherein the light sensing module is configured to sense a received light;
the identification module is configured to identify valleys and ridges of a fingerprint according to the light received by the light sensing module; and
the feedback module is configured to feed back a fingerprint result identified by the identification module to a driving chip.

23. A display device, comprising a display panel, wherein the display panel comprises:
a fingerprint identification area comprising a light-transmitting area and a non-light-transmitting area;
a plurality of support units disposed in the light-transmitting area and the non-light-transmitting area; and
a pixel definition layer comprising a plurality of aperture areas each exposing at least one light-emitting unit,
wherein each support unit of the plurality of support units is disposed between two long sides of two adjacent aperture areas of the plurality of aperture areas, the two long sides are adjacent and opposite to each other, the support unit has two opposite sides that are adjacent to the two long sides, respectively, and each of the two long sides directly faces at least one support unit of the plurality of support units,
wherein each side of the two opposite sides has an effective length that is parallel to and directly facing one of the two long sides adjacent thereto, the at least one support unit has a total effective length that is parallel and directly facing the long side, and the total effective length is smaller than a length of the long side; or
wherein the plurality of aperture areas is arranged in a plurality of columns, each aperture area in each column of the plurality of columns has short sides facing towards other columns of the plurality of columns, each single support unit of the plurality of support units is continuous and disposed in a region between two adjacent columns of the plurality of columns each support unit and has two long sides facing towards the two adjacent columns, respectively,
wherein each of the two long sides of a support unit that is between the two adjacent column and is directly adjacent to an aperture area in the two adjacent columns is longer than one of the short sides of the aperture area directly adjacent to the long side, and each side of the single support unit is inclined at an angle relative to one of the short sides of any aperture area in the two adjacent columns directly adjacent to the single support unit.

\* \* \* \* \*